(12) United States Patent
Buttolo et al.

(10) Patent No.: US 10,501,027 B2
(45) Date of Patent: *Dec. 10, 2019

(54) PROXIMITY SWITCH HAVING WRONG TOUCH ADAPTIVE LEARNING AND METHOD

(71) Applicant: Ford Global Technologies, LLC, Dearborn, MI (US)

(72) Inventors: Pietro Buttolo, Dearborn Heights, MI (US); Stuart C. Salter, White Lake, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/059,548

(22) Filed: Aug. 9, 2018

(65) Prior Publication Data

US 2018/0345882 A1 Dec. 6, 2018

Related U.S. Application Data

(63) Continuation of application No. 14/635,140, filed on Mar. 2, 2015, now Pat. No. 10,112,556, which is a (Continued)

(51) Int. Cl.
*B60R 16/00* (2006.01)

(52) U.S. Cl.
CPC ...... *B60R 16/005* (2013.01); *H03K 2217/945* (2013.01); *H03K 2217/94026* (2013.01); *Y10T 307/766* (2015.04); *Y10T 307/826* (2015.04)

(58) Field of Classification Search
CPC .............. B60R 16/005; Y10T 307/766; Y10T 307/826; H03K 2217/945; H03K 2217/94026
See application file for complete search history.

(56) References Cited

U.S. PATENT DOCUMENTS 3,382,588 A 5/1968 Serrell et al.
3,544,804 A 12/1970 Gaumer et al.
(Continued)

FOREIGN PATENT DOCUMENTS

CN 101853099 A 10/2010
DE 4024052 1/1992
(Continued)

OTHER PUBLICATIONS

"Clevios P Formulation Guide," 12 pages, www.clevios.com, Heraeus Clevios GmbH, no date provided.
(Continued)

*Primary Examiner* — Rexford N Barnie
*Assistant Examiner* — Elim Ortiz
(74) *Attorney, Agent, or Firm* — Vichit Chea; Price Heneveld LLP

(57) ABSTRACT

A proximity switch assembly and method are provided having wrong touch feedback and adaptive learning. The method includes the steps of detecting multiple attempted activations of a proximity switch that is not allowed, and adjusting one or more settings based on the detected multiple attempted activations to provide adaptive learning. The method also includes the steps of detecting an allowed activation of the proximity switch based on the adjusted one or more settings, and performing an action in response to the detected allowed activation. The proximity switch assembly includes one or more user perceived feedback devices for generating user perceived feedback when an attempted activation that is not allowed is detected.

19 Claims, 7 Drawing Sheets

Related U.S. Application Data continuation-in-part of application No. 13/288,549, filed on Nov. 3, 2011, now Pat. No. 8,994,228.

(56) References Cited

U.S. PATENT DOCUMENTS

| | | |
|---|---|---|
| 3,671,750 A | 6/1972 | Heitmann et al. |
| 3,691,396 A | 9/1972 | Hinrichs |
| 3,707,671 A | 12/1972 | Morrow et al. |
| 3,725,589 A | 4/1973 | Golden |
| 3,826,979 A | 7/1974 | Steinmann |
| 3,950,748 A | 4/1976 | Busy |
| 4,204,204 A | 5/1980 | Pitstick |
| 4,205,325 A | 5/1980 | Haygood et al. |
| 4,232,289 A | 11/1980 | Daniel |
| 4,257,117 A | 3/1981 | Besson |
| 4,290,052 A | 9/1981 | Eichelberger et al. |
| 4,340,813 A | 7/1982 | Sauer |
| 4,370,646 A | 1/1983 | Mahony |
| 4,374,381 A | 2/1983 | Ng et al. |
| 4,377,049 A | 3/1983 | Simon et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,954,823 A | 9/1990 | Binstead |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,050,634 A | 9/1991 | Fiechtner |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,212,621 A | 5/1993 | Panter |
| 5,215,811 A | 6/1993 | Reafler et al. |
| 5,225,959 A | 7/1993 | Stearns |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,367,199 A | 11/1994 | Lefkowitz et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,526,294 A | 6/1996 | Ono et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,015 A | 8/1998 | Iitsuka |
| 5,790,107 A | 8/1998 | Kasser et al. |
| 5,796,183 A | 8/1998 | Hourmand |
| 5,801,340 A | 9/1998 | Peter |
| 5,825,352 A | 10/1998 | Bisset et al. |
| 5,827,980 A | 10/1998 | Doemens et al. |
| 5,844,287 A | 12/1998 | Hassan et al. |
| 5,864,105 A | 1/1999 | Andrews |
| 5,867,111 A | 2/1999 | Caldwell et al. |
| 5,874,672 A | 2/1999 | Gerardi et al. |
| 5,880,538 A | 3/1999 | Schulz |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 5,982,608 A | 11/1999 | Kalnitsky et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,047,964 A | 4/2000 | Lawandy et al. |
| 6,075,460 A | 6/2000 | Minissale et al. |
| 6,140,914 A | 10/2000 | Mueller et al. |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,259,045 B1 | 7/2001 | Imai |
| 6,275,644 B1 | 8/2001 | Domas et al. |
| 6,288,707 B1 | 9/2001 | Philipp |
| 6,292,100 B1 | 9/2001 | Dowling |
| 6,297,811 B1 | 10/2001 | Kent et al. |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,404,158 B1 | 6/2002 | Boisvert et al. |
| 6,415,138 B2 | 7/2002 | Sirola et al. |
| 6,427,540 B1 | 8/2002 | Monroe et al. |
| 6,438,257 B1 | 8/2002 | Morimura et al. |
| 6,445,192 B1 | 9/2002 | Lovegren et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,535,694 B2 | 3/2003 | Engle et al. |
| 6,537,359 B1 | 3/2003 | Spa |
| 6,538,579 B1 | 3/2003 | Yoshikawa et al. |
| 6,559,902 B1 | 5/2003 | Kusuda et al. |
| 6,587,097 B1 | 7/2003 | Aufderheide et al. |
| 6,603,306 B1 | 8/2003 | Olsson et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,646,398 B1 | 11/2003 | Fukazawa et al. |
| 6,652,777 B2 | 11/2003 | Rapp et al. |
| 6,654,006 B2 | 11/2003 | Kawashima et al. |
| 6,661,239 B1 | 12/2003 | Ozick |
| 6,661,410 B2 | 12/2003 | Casebolt et al. |
| 6,664,489 B2 | 12/2003 | Kleinhans et al. |

(56) References Cited

U.S. PATENT DOCUMENTS

| | | |
|---|---|---|
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,943,705 B1 | 9/2005 | Bolender et al. |
| 6,960,735 B2 | 11/2005 | Hein et al. |
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,178,405 B2 | 2/2007 | Sato |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 | 8/2007 | Schmidt et al. |
| 7,255,622 B2 | 8/2007 | Stevenson et al. |
| 7,269,484 B2 | 9/2007 | Hein |
| 7,279,647 B2 | 10/2007 | Philipp |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,347,297 B2 | 3/2008 | Ide et al. |
| 7,355,593 B2 | 4/2008 | Hill et al. |
| 7,355,595 B2 | 4/2008 | Bathiche et al. |
| 7,358,963 B2 | 4/2008 | Low et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,447,575 B2 | 11/2008 | Goldbeck et al. |
| 7,479,788 B2 | 1/2009 | Bolender et al. |
| 7,489,053 B2 | 2/2009 | Gentile et al. |
| 7,518,381 B2 | 4/2009 | Lamborghini et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,576,611 B2 | 8/2009 | Glaser |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,654,147 B2 | 2/2010 | Witte et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,710,245 B2 | 5/2010 | Pickering |
| 7,714,846 B1 | 5/2010 | Gray |
| 7,719,142 B2 | 5/2010 | Hein et al. |
| 7,720,611 B2 | 5/2010 | Lemer |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,076,949 B1 | 12/2011 | Best et al. |
| 8,077,154 B2 | 12/2011 | Emig et al. |
| 8,090,497 B2 | 1/2012 | Ando |
| 8,253,425 B2 | 8/2012 | Reynolds et al. |
| 8,269,724 B2 | 9/2012 | Sakurai et al. |
| 8,279,092 B2 | 10/2012 | Vanhelle et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,386,027 B2 | 2/2013 | Chuang et al. |
| 8,400,423 B2 | 3/2013 | Chang et al. |
| 8,415,959 B2 | 4/2013 | Badaye |
| 8,454,181 B2 | 6/2013 | Salter et al. |
| 8,456,180 B2 | 6/2013 | Sitarski |
| 8,508,487 B2 | 8/2013 | Schwesig et al. |
| 8,514,185 B2 | 8/2013 | Hotelling |
| 8,517,383 B2 * | 8/2013 | Wallace ............... A63F 3/00643 235/435 |
| 8,537,107 B1 | 9/2013 | Li |
| 8,558,346 B2 | 10/2013 | Cheng et al. |
| 8,570,053 B1 | 10/2013 | Ryshtun et al. |
| 8,575,949 B2 | 11/2013 | Salter et al. |
| 8,599,144 B2 | 12/2013 | Peng et al. |
| 8,619,054 B2 | 12/2013 | Philipp et al. |
| 8,619,058 B2 | 12/2013 | Ito et al. |
| 8,624,609 B2 | 1/2014 | Philipp et al. |
| 8,659,414 B1 | 2/2014 | Schuk |

(56) References Cited

U.S. PATENT DOCUMENTS

| | | |
|---|---|---|
| 8,688,330 B2 | 4/2014 | Werner et al. |
| 8,724,038 B2 | 5/2014 | Ganapathi et al. |
| 8,736,432 B2 * | 5/2014 | Sitarski ............... B60K 35/00 340/425.5 |
| 8,736,577 B2 | 5/2014 | Land et al. |
| 8,796,575 B2 | 8/2014 | Salter et al. |
| 8,816,967 B2 | 8/2014 | Lyon et al. |
| 8,878,438 B2 | 11/2014 | Salter et al. |
| 8,908,034 B2 | 12/2014 | Bordonaro |
| 8,922,340 B2 | 12/2014 | Salter et al. |
| 8,928,336 B2 | 1/2015 | Salter et al. |
| 8,933,708 B2 | 1/2015 | Buttolo et al. |
| 8,981,265 B2 | 3/2015 | Jiao et al. |
| 9,088,282 B2 | 7/2015 | Holenarsipur et al. |
| 9,110,111 B1 | 8/2015 | Kapila et al. |
| 9,143,127 B2 | 9/2015 | Tamura et al. |
| 9,152,278 B2 | 10/2015 | Kent et al. |
| 9,182,837 B2 | 11/2015 | Day |
| 9,274,652 B2 | 3/2016 | Chang et al. |
| 9,372,538 B2 | 6/2016 | Pala et al. |
| 9,447,613 B2 | 9/2016 | Salter et al. |
| 9,548,733 B2 | 1/2017 | Buttolo et al. |
| 9,654,103 B2 | 5/2017 | Buttolo et al. |
| 9,944,237 B2 | 4/2018 | Buttolo et al. |
| 10,038,443 B2 | 7/2018 | Salter et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 | 7/2003 | Karray et al. |
| 2003/0128116 A1 | 7/2003 | Ieda et al. |
| 2003/0168271 A1 | 9/2003 | Massen |
| 2003/0189211 A1 | 10/2003 | Dietz |
| 2004/0056753 A1 | 3/2004 | Chiang et al. |
| 2004/0090195 A1 | 5/2004 | Motsenbocker |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0012484 A1 | 1/2005 | Gifford et al. |
| 2005/0052429 A1 | 3/2005 | Philipp |
| 2005/0068045 A1 | 3/2005 | Inaba et al. |
| 2005/0068712 A1 | 3/2005 | Schulz et al. |
| 2005/0073317 A1 | 4/2005 | Yamamoto et al. |
| 2005/0073425 A1 | 4/2005 | Snell et al. |
| 2005/0088417 A1 | 4/2005 | Mulligan |
| 2005/0092097 A1 | 5/2005 | Shank et al. |
| 2005/0110769 A1 | 5/2005 | DaCosta et al. |
| 2005/0137765 A1 | 6/2005 | Hein et al. |
| 2005/0183508 A1 | 8/2005 | Sato |
| 2005/0218913 A1 | 10/2005 | Inaba et al. |
| 2005/0242923 A1 | 11/2005 | Pearson et al. |
| 2005/0275567 A1 | 12/2005 | DePue et al. |
| 2005/0283280 A1 | 12/2005 | Evans, Jr. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0052907 A1 | 3/2006 | Hein |
| 2006/0055553 A1 | 3/2006 | Fergusson |
| 2006/0082545 A1 | 4/2006 | Choquet et al. |
| 2006/0170241 A1 | 8/2006 | Yamashita |
| 2006/0238518 A1 | 10/2006 | Westerman et al. |
| 2006/0238521 A1 | 10/2006 | Westerman et al. |
| 2006/0244733 A1 | 11/2006 | Geaghan |
| 2006/0250142 A1 | 11/2006 | Abe |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0024596 A1 | 2/2007 | Takahashi |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0115759 A1 | 5/2007 | Sano |
| 2007/0165005 A1 | 7/2007 | Lii et al. |
| 2007/0206668 A1 | 9/2007 | Jin |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0271072 A1 | 11/2007 | Kovacevich |
| 2007/0291016 A1 | 12/2007 | Philipp |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0084398 A1 | 4/2008 | Ito et al. |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150625 A1 | 6/2008 | Sundstrom |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0205714 A1 | 8/2008 | Benkley et al. |
| 2008/0211519 A1 | 9/2008 | Kurumado et al. |
| 2008/0231290 A1 | 9/2008 | Zhitomirsky |
| 2008/0238650 A1 | 10/2008 | Riihimaki et al. |
| 2008/0246723 A1 | 10/2008 | Baumbach |
| 2008/0257706 A1 | 10/2008 | Haag |
| 2008/0272623 A1 | 11/2008 | Kadzban et al. |
| 2009/0009482 A1 | 1/2009 | McDermid |
| 2009/0046110 A1 | 2/2009 | Sadler et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0212849 A1 | 8/2009 | Reime |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0256578 A1 | 10/2009 | Wuerstlein et al. |
| 2009/0256677 A1 | 10/2009 | Hein et al. |
| 2009/0273563 A1 | 11/2009 | Pryor |
| 2009/0273573 A1 | 11/2009 | Hotelling |
| 2009/0295409 A1 | 12/2009 | Irkliy |
| 2009/0295556 A1 | 12/2009 | Inoue et al. |
| 2009/0309616 A1 | 12/2009 | Klinghult et al. |
| 2010/0001746 A1 | 1/2010 | Duchene et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0053087 A1 | 3/2010 | Dai et al. |
| 2010/0066391 A1 | 3/2010 | Hirasaka et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0117970 A1 | 5/2010 | Burstrom et al. |
| 2010/0125393 A1 | 5/2010 | Jarvinen et al. |
| 2010/0156814 A1 | 6/2010 | Weber et al. |

(56) References Cited

U.S. PATENT DOCUMENTS

| | | |
|---|---|---|
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1 | 8/2010 | Salter et al. |
| 2010/0214253 A1 | 8/2010 | Wu et al. |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0252048 A1 | 10/2010 | Young et al. |
| 2010/0252408 A1 | 10/2010 | Yamauchi et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0309160 A1 | 12/2010 | Lin |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012378 A1 | 1/2011 | Ueno et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0041409 A1* | 2/2011 | Newman ............ E05F 15/46 49/324 |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0057899 A1 | 3/2011 | Sleeman et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0074684 A1 | 3/2011 | Abraham et al. |
| 2011/0074701 A1* | 3/2011 | Dickinson ............ G06F 3/041 345/173 |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0084707 A1 | 4/2011 | Nakayama et al. |
| 2011/0095997 A1 | 4/2011 | Philipp |
| 2011/0096025 A1 | 4/2011 | Slobodin et al. |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0139934 A1 | 6/2011 | Giesa et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0163764 A1 | 7/2011 | Shank et al. |
| 2011/0169758 A1 | 7/2011 | Aono |
| 2011/0181387 A1 | 7/2011 | Popelard |
| 2011/0187492 A1 | 8/2011 | Newman et al. |
| 2011/0210755 A1 | 9/2011 | Ogawa |
| 2011/0227872 A1 | 9/2011 | Huska et al. |
| 2011/0279276 A1 | 11/2011 | Newham |
| 2011/0279409 A1 | 11/2011 | Salaverry et al. |
| 2011/0309912 A1 | 12/2011 | Muller |
| 2012/0007821 A1 | 1/2012 | Zaliva |
| 2012/0037485 A1* | 2/2012 | Sitarski ............ H03K 17/955 200/600 |
| 2012/0043973 A1 | 2/2012 | Kremin |
| 2012/0043976 A1 | 2/2012 | Bokma et al. |
| 2012/0055557 A1 | 3/2012 | Belz et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0075246 A1 | 3/2012 | Chang et al. |
| 2012/0104790 A1 | 5/2012 | Plavetich et al. |
| 2012/0126941 A1 | 5/2012 | Coggill |
| 2012/0154324 A1 | 6/2012 | Wright et al. |
| 2012/0160657 A1 | 6/2012 | Mizushima |
| 2012/0161795 A1 | 6/2012 | Pfau et al. |
| 2012/0194460 A1 | 8/2012 | Kuwabara et al. |
| 2012/0217147 A1 | 8/2012 | Porter et al. |
| 2012/0293447 A1 | 11/2012 | Heng et al. |
| 2012/0312676 A1 | 12/2012 | Salter et al. |
| 2012/0313767 A1 | 12/2012 | Sitarski |
| 2012/0319992 A1 | 12/2012 | Lee |
| 2013/0002419 A1 | 1/2013 | Lee |
| 2013/0024169 A1 | 1/2013 | Veerasamy |
| 2013/0033356 A1 | 2/2013 | Sitarski et al. |
| 2013/0036529 A1 | 2/2013 | Salter et al. |
| 2013/0076121 A1 | 3/2013 | Salter et al. |
| 2013/0076375 A1 | 3/2013 | Hanumanthaiah et al. |
| 2013/0093500 A1 | 4/2013 | Bruwer |
| 2013/0106436 A1 | 5/2013 | Brunet et al. |
| 2013/0113544 A1 | 5/2013 | Salter et al. |
| 2013/0126325 A1 | 5/2013 | Curtis et al. |
| 2013/0147709 A1 | 6/2013 | Kim et al. |
| 2013/0162596 A1 | 6/2013 | Kono et al. |
| 2013/0170013 A1 | 7/2013 | Tonar et al. |
| 2013/0241578 A1 | 9/2013 | Satake et al. |
| 2013/0270896 A1 | 10/2013 | Buttolo et al. |
| 2013/0270899 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |
| 2014/0116869 A1 | 5/2014 | Salter et al. |
| 2014/0145733 A1 | 5/2014 | Buttolo et al. |
| 2014/0210257 A1 | 7/2014 | Buttolo et al. |
| 2014/0252879 A1 | 9/2014 | Dassanayake et al. |
| 2014/0278194 A1 | 9/2014 | Buttolo et al. |
| 2014/0278240 A1 | 9/2014 | Buttolo et al. |
| 2014/0293158 A1 | 10/2014 | Kurasawa et al. |
| 2014/0300403 A1 | 10/2014 | Okamoto et al. |
| 2014/0306723 A1 | 10/2014 | Salter et al. |
| 2014/0306724 A1 | 10/2014 | Dassanayake et al. |
| 2015/0042603 A1 | 2/2015 | Takano et al. |
| 2015/0077227 A1 | 3/2015 | Salter et al. |
| 2015/0177876 A1 | 6/2015 | Ishii et al. |
| 2015/0229305 A1 | 8/2015 | Buttolo et al. |
| 2015/0234493 A1 | 8/2015 | Parivar et al. |

FOREIGN PATENT DOCUMENTS

| | | |
|---|---|---|
| EP | 1152443 | 11/2001 |
| EP | 1327860 | 7/2003 |

(56) References Cited

FOREIGN PATENT DOCUMENTS

| | | |
|---|---|---|
| EP | 1562293 | 8/2005 |
| EP | 2133777 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |
| KR | 101258376 | 4/2013 |
| TW | 201032114 A | 9/2010 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012169106 | 12/2012 |

OTHER PUBLICATIONS

"Introduction to Touch Solutions, White Paper, Revision 1.0 A," Densitron Corporation, 14 pages, Aug. 21, 2007.
Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.
NXP Capacitive Sensors, 1 page, www.nxp.com, copyrighted 2006-2010, NXP Semiconductors.
"Moisture Immunity in QuickSense Studio," AN552, Rev. 0.1 Oct. 2010, 8 pages, Silicon Laboratories, Inc., © 2010.
"Orgacon EL-P3000, Screen printing Ink Series 3000," 2 pages, AGFA, last updated in Feb. 2006.
"Charge-Transfer Sensing-Based Touch Controls Facilitate Creative Interfaces," www.ferret.com.au, 2 pages, Jan. 18, 2006.
Kiosk Peripherals, "Touch Screen," www.bitsbytesintegrators.com/kiosk-peripherals.html, 10 pages, no date provided.
JVC KD-AVX777 Detachable Front-Panel with Integrated 5.4" Touch-Screen Monitor, 6 pages, www.crutchfield.com, no date provided.
Ergonomic Palm Buttons, Pepperl+Fuchs, www.wolfautomation.com, 6 pages, no date provided.
"Touch Sensors Design Guide" by ATMEL, 10620 D-AT42-04/09, Revised Apr. 2009, 72 pages, Copyrighted 2008-2009 Atmel Corporation.
"Capacitive Touch Switches for Automotive Applications," by Dave Van Ess of Cypress Semiconductor Corp., published in Automotive DesignLine (http://www.automotivedesignline.com), Feb. 2006, 7 pages.

\* cited by examiner ptions, claims, and appended drawings.

PROXIMITY SWITCH HAVING WRONG TOUCH ADAPTIVE LEARNING AND METHOD

CROSS-REFERENCE TO RELATED APPLICATIONS

This application is a continuation of U.S. patent application Ser. No. 14/635,140, filed Mar. 2, 2015, entitled "PROXIMITY SWITCH HAVING WRONG TOUCH ADAPTIVE LEARNING AND METHOD," now U.S. Pat. No. 10,112,556, which is a continuation-in-part of U.S. patent application Ser. No. 13/288,549, filed on Nov. 3, 2011, now U.S. Pat. No. 8,994,228, entitled "PROXIMITY SWITCH HAVING WRONG TOUCH FEEDBACK." The aforementioned related application is hereby incorporated by reference.

FIELD OF THE INVENTION

The present invention generally relates to switches, and more particularly relates to proximity switches with enhanced user feedback and user interaction.

BACKGROUND OF THE INVENTION

Automotive vehicles are typically equipped with various user actuatable switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Switch assemblies often employ a plurality of capacitive switches in close proximity to one another and require that a user select a single desired capacitive switch to perform the intended operation. Users frequently activate the wrong switch, such as activating multiple switches simultaneously, particularly when the user interface devices are small and the switches are close together. In some applications, such as in an automobile, the driver of the vehicle has limited ability to view the switches due to driver distraction and therefore may inadvertently operate the switch in a wrong manner. Accordingly, it is desirable to provide for a proximity switch arrangement, which enhances the use of the proximity switches by a person, such as a driver in a vehicle.

SUMMARY OF THE INVENTION

According to one aspect of the present invention, a method of activing a proximity switch assembly is provided. The method includes the steps of detecting multiple attempted activations of a proximity switch that is not allowed. The method also includes the steps of adjusting one or more settings based on the detected multiple attempted activations to provide adaptive learning and detecting an allowed activation of the proximity switch based on the adjusted one or more settings. The method further includes the step of performing an action in response to the detected allowed activation.

According to another aspect of the present invention, a proximity switch assembly is provided. The proximity switch assembly includes one or more proximity switches and control circuitry processing an activation field associated with each proximity switch to detect an allowed activation of a proximity switch. The control circuitry further detects multiple attempted activations of a switch that is not allowed and adjusts one or more settings based on the attempted activation to provide adaptive learning.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
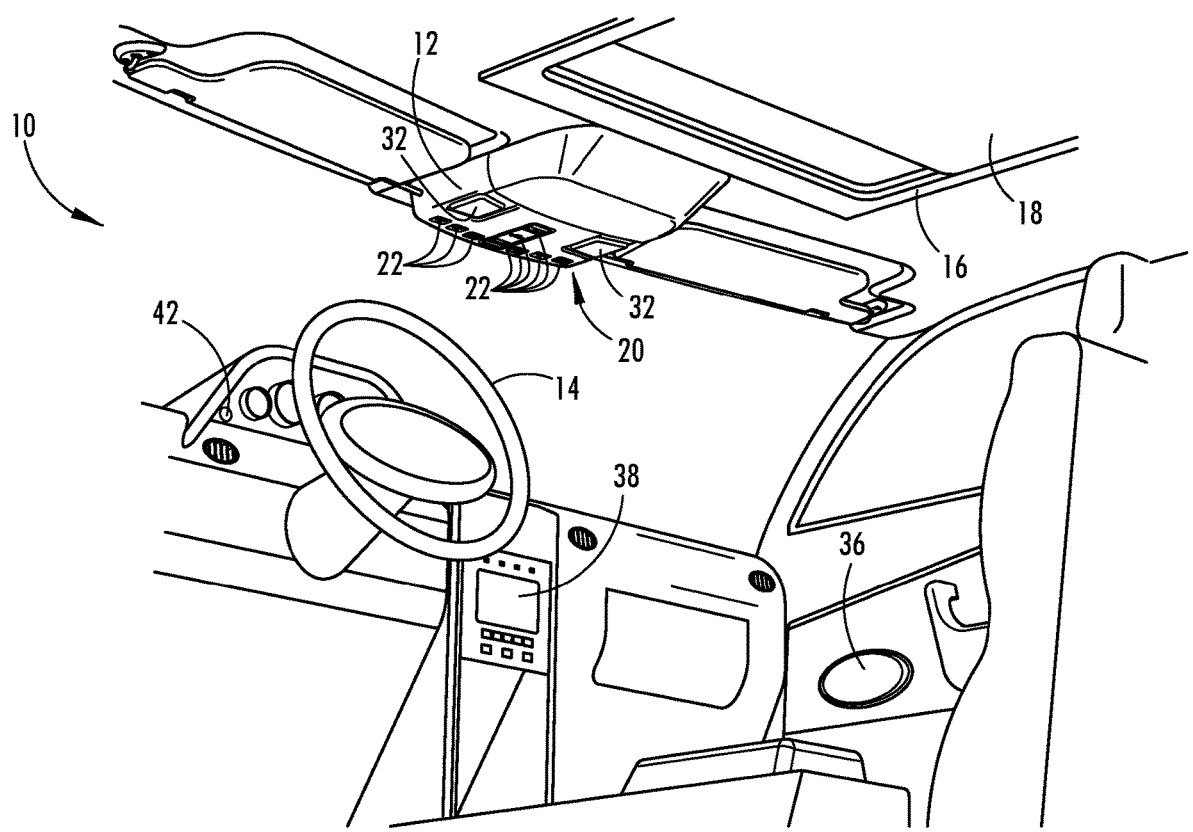
FIG. 1 is a perspective view of a passenger compartment of an automotive vehicle having an overhead console employing a proximity switch assembly having user perceived feedback and adaptive learning, according to one embodiment.
Figure 2:
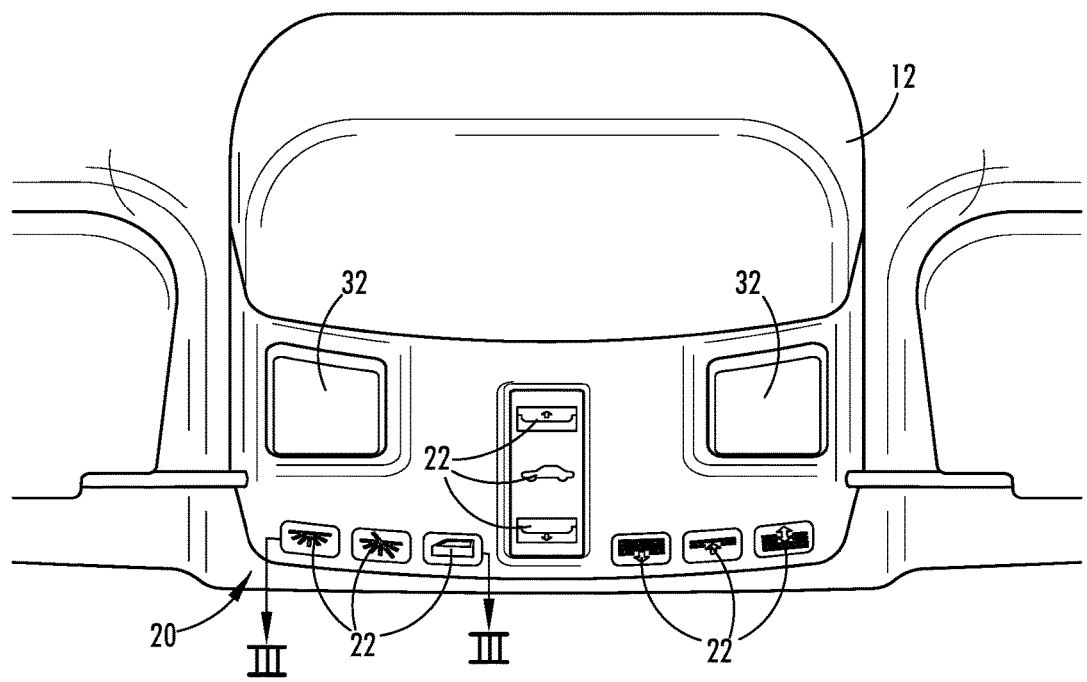
FIG. 2 is an enlarged view of the overhead console and proximity switch assembly shown in FIG. 1.

Referring to FIGS. 1 and 2, the interior of an automotive vehicle 10 is generally illustrated having a passenger compartment and a switch assembly 20 employing a plurality of proximity switches 22 having user perceived feedback and adaptive learning, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged close to one another in the overhead console 12, according to one embodiment. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 32, and various other devices and functions. However, it should be appreciated that the proximity switches 22 may be located elsewhere on the vehicle 10, such as in the dash panel, on other consoles such as a center console, integrated into a touch screen display for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 each provide control of a vehicle component or device or provide a designated control function. One or more of the proximity switches 22 may be dedicated to controlling movement of a sunroof or moonroof 16 so as to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to control other devices, such as turning an interior map/reading light on, turning an interior map/reading light off, turning a dome lamp on or off, unlocking a trunk, opening a rear hatch, or for defeating a door light switch. Additional controls via the proximity switches 22 may include actuating door power windows up and down. Various other vehicle controls may be controlled by way of the proximity switches 22 described herein.

The proximity switch assembly 20 includes one or more user perceived feedback devices for generating user perceived feedback when an attempted activation of a proximity switch is not allowed. The user perceived feedback devices may include an audible tone generator such as one or more vehicle speakers 36 shown installed in the doors of the vehicle. Any of the vehicle equipped speakers or other audible tone generators may be employed to provide an audible tone to the user upon wrong touch activation of the switch assembly 20. Other feedback devices may include a visual display, such as navigation or radio display 38 shown installed in the vehicle. The visual display 38 may display text or icons as feedback indicative of a wrong touch of the proximity switch assembly 20. Further feedback devices may include a vibratory or tactile generator 40 for providing a vibration as a feedback. The vibratory generator may be implemented as an eccentric motor, according to one embodiment. The vibratory generator 40 may be integrated within the proximity switch assembly 20 or within the individual proximity switches 22 to generate vibration to the user's finger, according to one embodiment. According to other embodiments, the vibratory generator 40 may be located within the steering wheel 14 of the vehicle, the vehicle seat, or other point of contact with the user to provide a vibration that is perceived by the user upon wrong touch of the proximity switch assembly 20. A further feedback device may include one or more indicator lights 42 for providing a visual light indication as a feedback indicative of a wrong touch activation of the proximity switch assembly. The indicator light 42 may include a dedicated light installed in the instrument panel cluster, as shown, or other dedicated or shared lighting devices including mood or ambient lighting, dome lighting, map reading lights, electronic display lighting, and other lighting available and viewable by a user of the proximity switch assembly 20.

Figure 3:
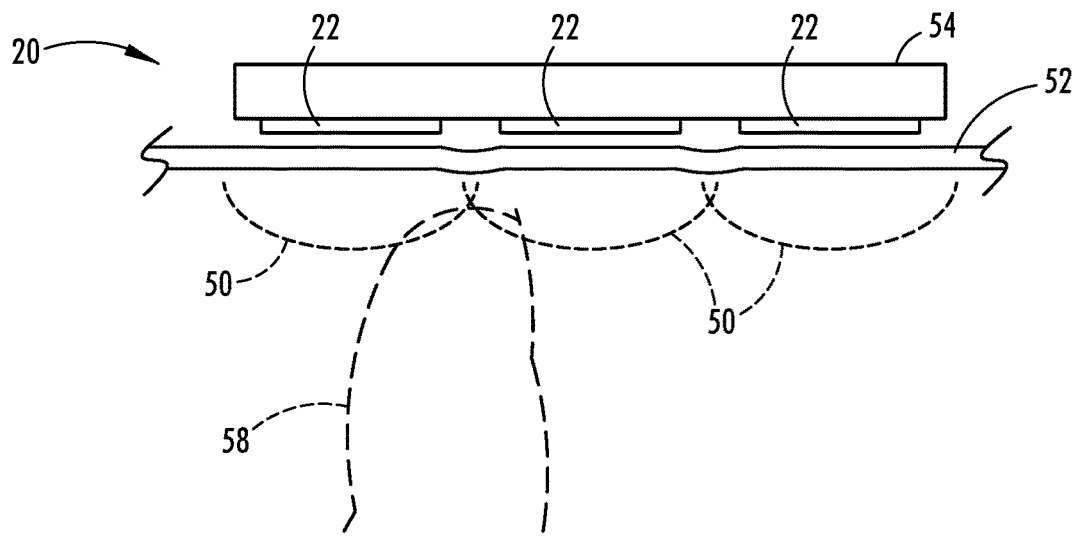
FIG. 3 is an enlarged cross-sectional view taken through line in FIG. 2 showing the proximity switches in relation to a user's finger.

Referring to FIG. 3, a portion of the proximity switch assembly 20 is illustrated having three serial arranged proximity switches 22 in close relation to one another in relation to a user's finger 58 during a wrong touch activation of the switch assembly 20. Each proximity switch 22 includes one or more proximity sensors mounted on a substrate 54 for generating a sense activation field 50. A contact surface 52 such as a film covers the proximity switches 22. In the embodiment shown, adjacent sense activation fields 50 generated by adjacent proximity switches 22 overlap slightly. When a user, such as the user's finger 58, enters the activation field, the proximity switch assembly 20 detects the disturbance to the activation field and determines an activation of the corresponding proximity switch 22. However, when a user simultaneously contacts two switches, such that the finger 58 simultaneously enters activation fields 50 for adjacent proximity sensors, a wrong touch condition may exist. When a wrong touch condition is initially detected, activation of the proximity switches is not allowed and a user perceived feedback may be provided to the user to let the user know of the wrong touch condition. A wrong touch condition may occur when a user attempted to interact with the proximity switch 22, but no clear activation is detected. Examples of wrong touch conditions include one or more of the following: the user simultaneously contacting two switches; an insufficient signal response is detected due to poor conductive qualities of the fingers, such as a finger containing lotion or having a glove covering the finger; and a finger that slowly approaches a switch, especially one having a glove on the finger. It should be appreciated that other examples of wrong touch conditions may exist.

Figure 4:
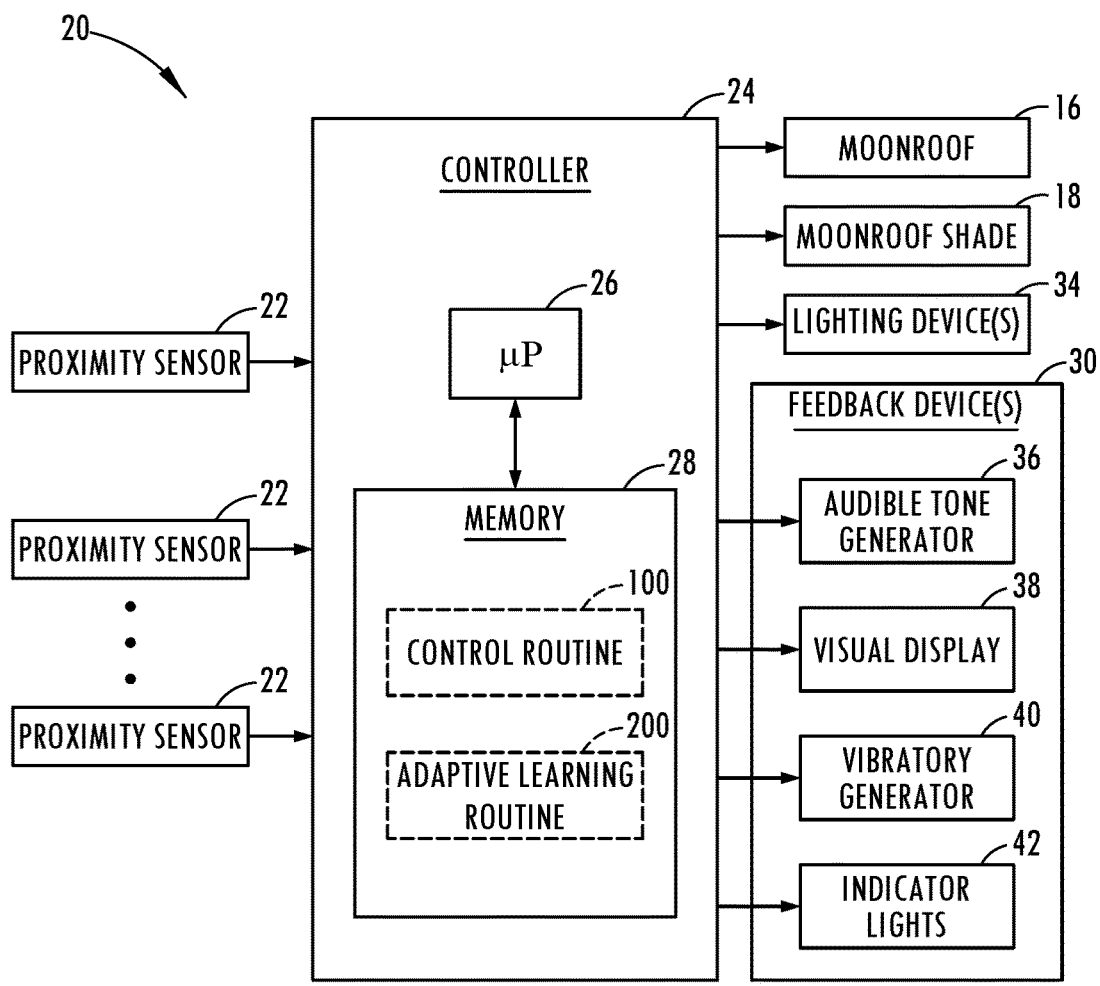
FIG. 4 is a block diagram illustrating the proximity switch assembly having user perceived feedback and adaptive learning, according to one embodiment.

Referring to FIG. 4, the proximity switch assembly 20 is illustrated according to one embodiment. A plurality of proximity switches 22 are shown providing inputs to a controller 24. The controller 24 may include control circuitry, such as a microprocessor 26 and memory 28. The control circuitry may include sense control circuitry processing the activation field to sense user activation of the switch by comparing the activation field to a threshold. It should be appreciated that other analog and/or digital control circuitry may be employed to process the activation field, determine user activation, initiate an action, generate user perceived feedback and execute and implement adaptive learning. The controller 24 provides an output signal to one or more devices that are configured to perform dedicated actions responsive to correct activation of a proximity switch. For example, the one or more devices may include a moonroof 16 having a motor to move the moonroof panel between open and closed and tilt positions, a moonroof shade 18 that moves between open and closed positions, and light devices 34 that may be turned on and off. Other devices may be controlled such as a radio for performing on and off functions, volume control, scanning, and other types of devices for performing other dedicated functions. One of the proximity switches 22 may be dedicated to actuating the moonroof closed, another proximity switch 22 may be dedicated to actuating the moonroof open, and a further switch 22 may be dedicated to actuating the moonroof to a tilt position, all of which would cause a motor to move the moonroof to a desired position. The moonroof shade 18 may be opened in response to one proximity switch 22 and may be closed responsive to another proximity switch 22.

The controller 20 provides an output signal to one or more user perceived feedback devices 30 to generate a perceived feedback to a user. According to one embodiment, the user perceived feedback devices 30 may include an audible tone generator 36, such as a speaker, for generating an audible signal such as a tone and/or voice commands. According to another embodiment, the one or more user feedback devices 30 may include a tactile vibratory generator 40 for generating a vibration of the proximity switch pad or some other device or surface, such as a steering wheel or an armrest or seat upon which the user is seated in. According to a further embodiment, the feedback device 30 may include one or more indicator lights 42 for providing a light output. Further, the feedback device 30 may employ a visual display 38 to display feedback information in the form of text or icons. The user perceived feedback devices 30 provide an audible tone, vibration, light and/or visual display to the user in response to activation of the one or more proximity switches.

When a user attempts to activate a switch with a wrong touch condition, a first or wrong touch feedback may be generated to indicate to the user that the switch was wrongly activated. A wrong touch activation may include simultaneous activation of two switches, according to one embodiment. When a wrong touch is repeatedly detected, the switch assembly may adaptively learn the intended switch activation and adjust one or more settings to allow activation of a switch. The user perceived feedback device 30 may generate a second or action completed feedback to the user when the action actuated has completed the action. A third or right touch feedback may be generated when an allowed activation of a proximity switch is detected.

The controller 42 processes one or more routines including routine 100 to generate user perceived feedback based on activation of one or more of the proximity switches 22. The controller monitors the proximity switches for an activation of one or more of the proximity switches and performs the dedicated action when a right touch activation is detected. When an activation is properly detected, a right touch feedback may be provided by any of the feedback devices 30. The controller 42 also monitors for proximity sensors 22 for the presence of a wrong touch activation of the proximity sensor assembly and generates a wrong touch feedback in response thereto. The wrong touch condition may be due to an ambiguous input such as a simultaneous activation of two or more switches, or may be the activation of a switch for which an action cannot be performed. The feedback generated for a wrong touch is different than the feedback generated for a right touch so that the user may decipher between wrong touch and right touch activations of the proximity switch assembly 20. The controller 42 further determines when the action actuated by the activation of a proximity switch is complete and provides in response thereto an action complete feedback via one or more of the feedback devices 30. The action complete feedback is different than the wrong touch feedback and the right touch feedback such that a user may decipher the differences therebetween.

Figure 5:
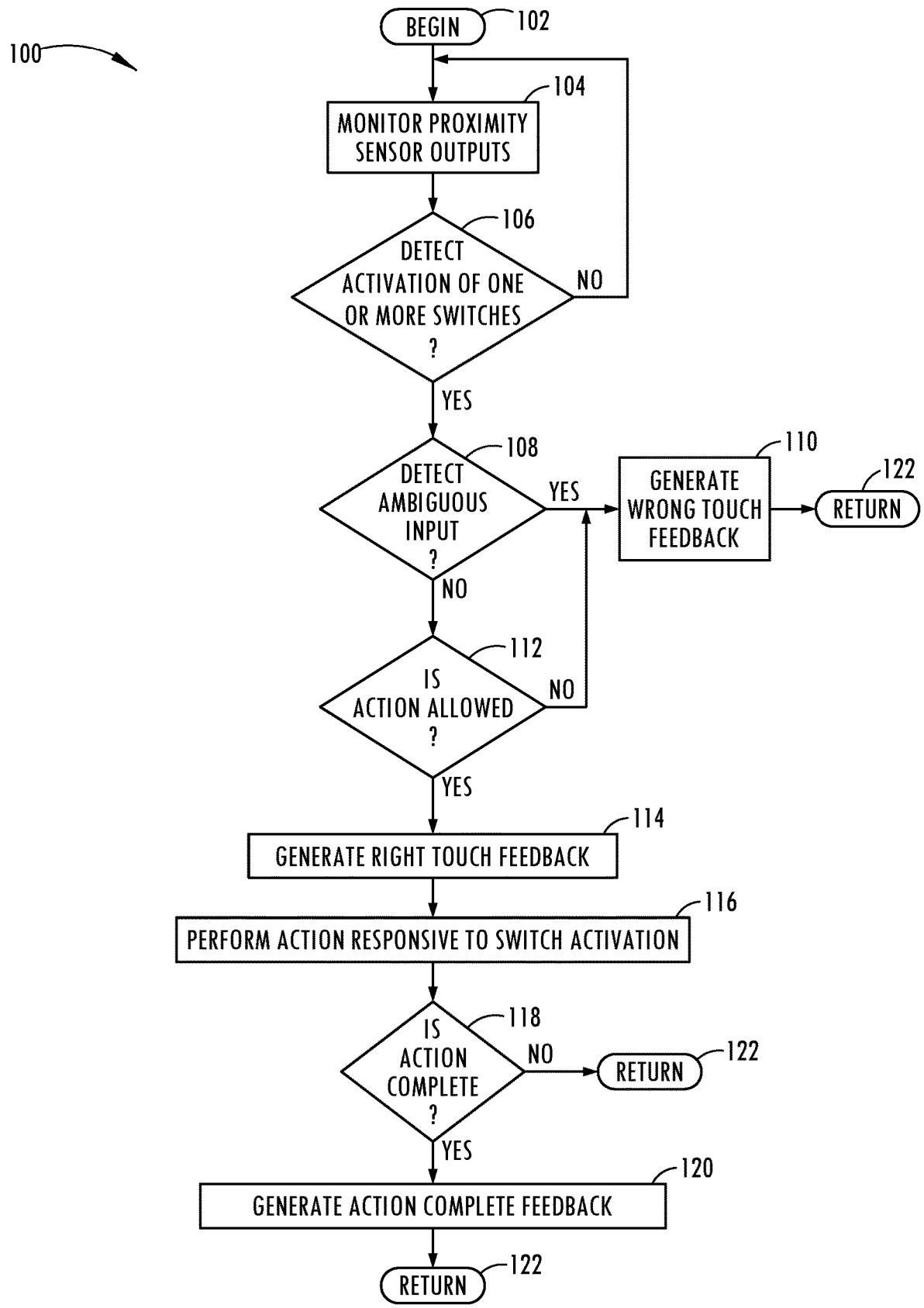
FIG. 5 is a flow diagram illustrating a routine for providing user perceived feedback based on activation of the proximity switches, according to one embodiment.

Referring to FIG. 5, the control routine 100 is illustrated, according to one embodiment. Routine 100 begins at step 102 and proceeds to step 104 to monitor the proximity sensor outputs for each switch. Next, at decision step 106, routine 100 detects activation of one or more proximity switches and, if no activation is detected, returns to step 104. If the activation of one or more proximity switches is detected, routine 100 proceeds to decision step 108 to look for an ambiguous input. The ambiguous input may include the attempted simultaneous activation of two or more proximity switches. If an ambiguous input is detected, routine 100 generates the wrong touch feedback at step 110 and then returns at step 122. If no ambiguous input is detected, routine 100 proceeds to decision step 112 to determine if the action dedicated to that activated proximity switch is allowed and, if not, generates a wrong touch feedback at step 110, and then returns at step 122. Accordingly, either an ambiguous input or activation or a switch for which an action is not allowed are deemed to be wrong touch activations for which an action cannot be performed. In response thereto, a wrong touch feedback is generated by one or more of the feedback devices including the audible tone generator 36, visual display 38, vibratory generator 40, and indicator light(s) 42. The wrong touch feedback may be a user perceived alert type feedback that a user would perceive as an incorrect activation of the proximity switch assembly 20.

If no wrong touch activation exists, routine 100 proceeds to step 114 to generate a right touch feedback. A right touch feedback may be generated with any one or more of the feedback devices to provide a second more pleasant feedback recognizable by a user as proper activation of a proximity switch for which an action can be performed. At step 116, the action responsive to the switch activation is performed. Next, routine 100 proceeds to step 118 to determine if the action is complete and, if not, returns to step 122. If the action is complete, routine 100 then generates an action complete feedback via one or more of the feedback devices 30. The action complete feedback is a third pleasant tone feedback recognizable by a user as completion of the action in response to activation of the proximity switch.

According to another embodiment, the right touch feedback may be generated to provide multiple levels of feedback, such as a progressive feedback. For example, when two signal channels for adjacent capacitive switches are at a substantially similar signal level, a wrong touch feedback may be provided at a first level, however, when one channel is significantly greater than the other channel, the wrong touch feedback may be at a second lower level relative to the first feedback. This may indicate to the operator that the wrong touch is not as severe or significant when one signal channel is substantially greater than another indicative that the correct signal was substantially activated. This may help to provide feedback to the user so that the user may understand why the input is deemed wrong and how to modify hand posture to get the action recognized correctly. According to another example, for a non-allowed action, multiple levels of progressive feedback may be provided, such as to provide a first higher feedback when a user attempts to open a moonroof while the vehicle is in a car wash and provides a second lower feedback when the user is trying to close a moonroof that is already closed.

A proximity switch assembly and a method of activating a proximity switch assembly that detects multiple attempted activations of one or more proximity switches that is not allowed and adjusts one or more settings based on the detected multiple attempted activations to provide adaptive learning is further provided according to another embodiment. The proximity switch assembly and method advantageously detects multiple or repeated failed attempts to activate a proximity switch and adaptively learns from the multiple failed attempts and adjusts one or more settings to enable activation of the switch. Each time a wrong touch condition is detected, one or more feedbacks may be generated as described above. If a user repeatedly tries to interact with the proximity switch assembly while in the wrong touch mode, the proximity switch assembly and method can adjust one or more settings to adapt to the user's interface signature. The proximity switch assembly and method can adjust the one or more settings autonomously to allow for less clean interface (e.g., touch) or may further prompt the user for guidance and request from the user which type of activation was intended. The attempted activation that is not allowed is referred to as a wrong touch and may occur with the simultaneous activation of two or more switches which may be caused by a user's finger overlapping the activation fields associated with two or more proximity sensors associated with two adjacent proximity switches. Other wrong touch conditions include attempted activations by a user having a finger with poor conductive properties, such as a finger having lotion or covered by an electrically insulative glove which may result in insufficient signal response. Further attempted activations for wrong touch may include a user's finger slowly approaching a proximity switch, particularly when the finger is covered by a glove.

In response to detecting multiple attempted activations of a wrong touch condition, the system and method advantageously may adjust one or more settings to tune the proximity switch assembly to thereby provide adaptive learning. The adjustment of one or more settings may include adjusting one or more activation thresholds that are used to determine switch activation, adjusting a clean signal band, adjusting a signal or signature ratio which defines how the signal is distributed amongst the sensors, adjusting a minimum rate or rise time of the signal, and other potential adjustments of settings associated with determining an activation of a proximity switch. Examples of various settings used for determining switch activation that can be adjusted are disclosed in U.S. Patent Application Publication No. 2013/0270896 A1 entitled "PROXIMITY SWITCH ASSEMBLY AND ACTIVATION METHOD," which is hereby incorporated herein by reference.

The new adjusted setting(s) can be active for a predetermined time, such as until a certain number of consecutive clear activations is detected or may be permanently adjusted. The adjusted setting(s) may be used on one or all of a plurality of proximity switches associated with the proximity switch assembly, or may be used on only a select group of proximity switches. The new adjusted settings can apply to all users (e.g., occupants of the vehicle), or different settings could be implemented for specific users. Detection of specific occupants could be based on internal vehicle sensors, key fobs or personal electronics.

Figure 6A:
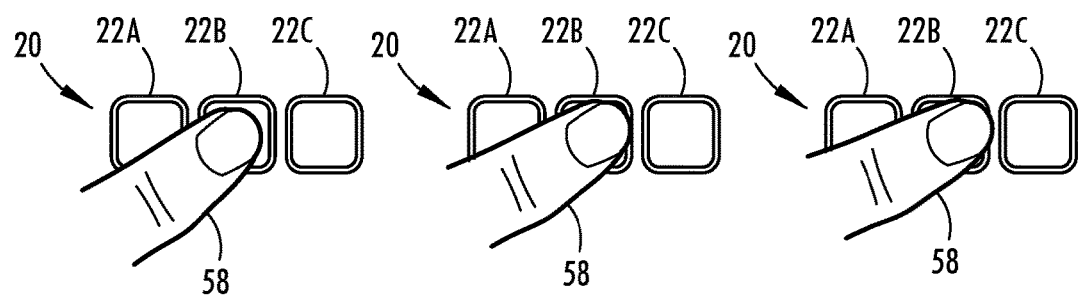
FIG. 6A is a front view of a switch assembly showing a user's finger repeatedly attempting to activate a proximity switch with wrong touch.
Figure 6B:
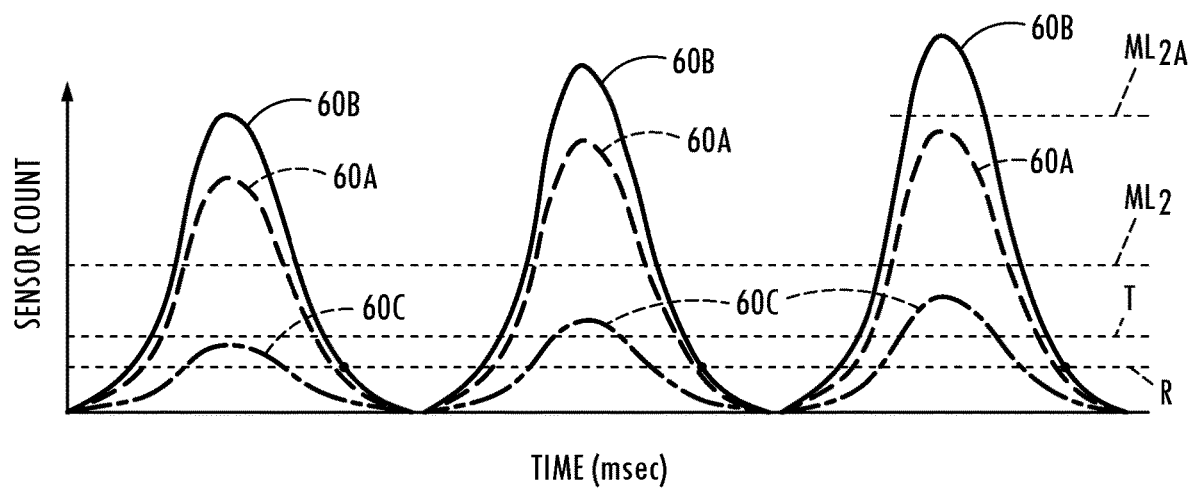
FIG. 6B is a graph illustrating adaptive learning by adjusting the signature ratio to allow activation during the wrong touch of FIG. 6A, according to one embodiment.

Referring to FIGS. 6A and 6B, one example of a wrong touch condition having a failed channel signal ratio is shown as a user's finger 58 presses on the middle proximity switch 22B located between proximity switches 22B and 22C. The user's finger 58 is shown in FIG. 6A pressing on proximity switch 22B to attempt activation of the proximity switch 22B, but experiences a wrong touch condition each time the activation is attempted because the signal channel ratio of the largest signal relative to the second largest signal or the cumulative of all signal channels is not sufficient to allow for activation. In this example, the three signals 60A-60C are generated by three proximity sensors associated with the respective three proximity switches 22A-22C. The signal associated with each of the sensors is shown as a function of the sensor count as a function of time. As a user's finger 58 approaches the switch assembly, the finger 58 enters the activation field associated with each sensor which causes disruption to the capacitance, thereby resulting into a sensor count increase as shown by signals 60A-60C. In this example, the user's finger 58 is primarily on the middle proximity switch 22B; however, the finger 58 partially extends over the adjacent proximity switch 22A. As a result, the activation field causes the signal 60B associated with the second proximity switch 22B to be the largest signal and to generate a substantially large but lesser second largest signal 60A associated with proximity switch 22A. When the second largest signal 60A has a substantial amplitude greater than a second channel max level $ML_2$, activation of the proximity switch 22B generating the largest signal 60B is prevented. As a user presses harder each repeated attempt to activate the same switch, the signal associated with each of the sensors may get larger, but the signal channel signature ratio does not change which may occur due in part to the user's finger contacting the adjacent capacitive switch 22A, such that sufficient signal is detected therewith. The system and method advantageously detects the multiple repeated attempts of a wrong touch condition and adjusts the setting of the second channel max level $ML_2$ so as to increase the level to an adjusted second channel max level $ML_{2A}$ which relaxes the signature ratio to allow activation of the proximity switch. As a result, the adjustment of the second channel max level $ML_{2A}$ to an increased threshold allows for activation of the proximity switch 22B due to the adaptive learning achieved by the adjustment of the setting.

Figure 7:
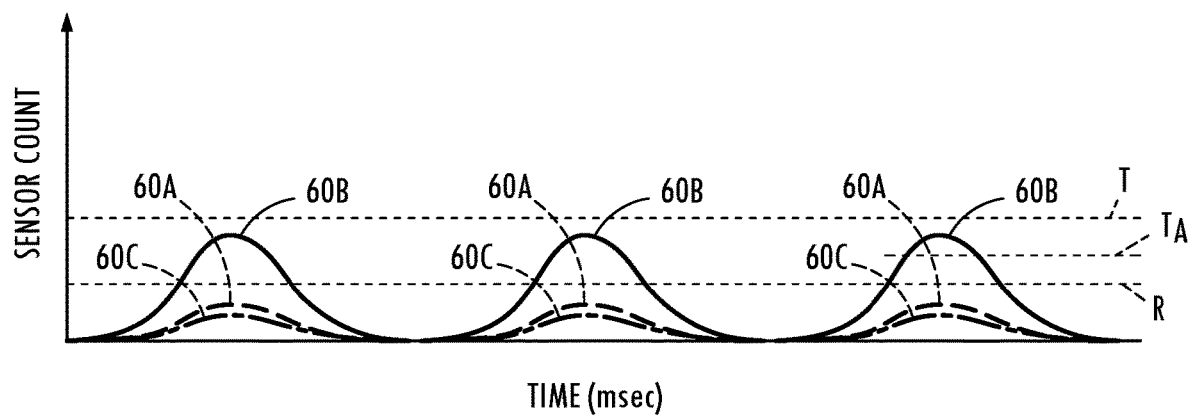
FIG. 7 is a graph illustrating adaptive learning by adjusting the activation threshold setting, according to a another embodiment.

Referring to FIG. 7, one example of a signal response during a wrong touch condition and adaptive learning thereof is illustrated for circumstances where the user's attempted activation generates a signal that is not strong enough to exceed the activation threshold T. When the user repeatedly attempts to activate a proximity switch, such as proximity switch 22B, signal 60B associated with switch 22B is weak and is shown below threshold T. When this occurs, the proximity switch assembly and method advantageously adjusts the threshold T to a reduced or adjusted threshold value $T_A$ which is shown at a lesser value below the maximum signal peak. This allows for activation of the proximity switch 22B by adjusting the threshold T to the adjusted lower threshold $T_A$ to relax the activation threshold.

Figure 8:
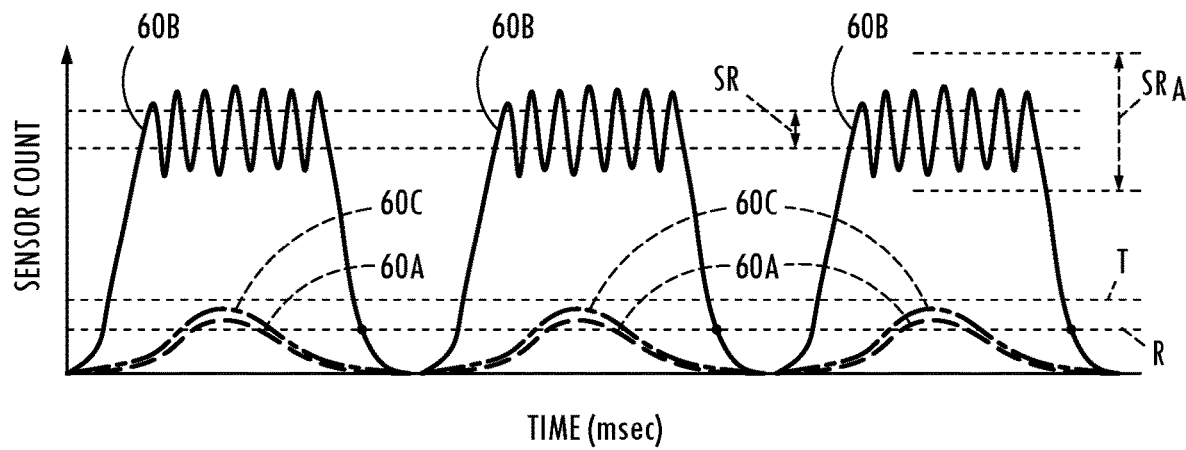
FIG. 8 is a graph illustrating adaptive learning by adjusting the signal stable range to allow activation following a wrong touch, according to another embodiment.

Referring to FIG. 8, one example of the signal response during a wrong touch condition and adaptive learning thereof is illustrated. The three signals 60A-60C shown are generated by three proximity sensors associated with three proximity switches as discussed in FIG. 6A. As a user's finger approaches the switch assembly, the finger enters the activation field associated with each sensor which causes disruption to the capacitance, thereby resulting in a sensor count increase as shown by signals 60A-60C. In this example, a user attempts to activate one of the switches as shown by signal 60B which is much greater in amplitude compared to signals 60A and 60B associated with two other proximity switches. The larger signal response 60B generates a larger signal count compared to the other signals 60A and 60B as a result of the interaction with the associated switch. In this example, a stable range SR of the largest signal 60B is required to activate the corresponding proximity switch. The largest signal 60B is shown having oscillations at its peak amplitude that create an unstable signal relative to the stable range SR. Each time that an operator attempts to activate the corresponding proximity switch, the signal 60B rises up but is unstable such that the range of oscillation at its peak of the signal exceeds the stable range SR required to detect an activation of the proximity switch. The proximity switch assembly and method may advantageously identify the repeated occurrence of this wrong touch condition and make a decision that an operator is intending to activate the corresponding proximity switch, but the finger is not sufficiently stable (e.g., shaking finger) on the switch pad during multiple repeated attempts or there is excess noise present in the signal. The proximity switch assembly and method may advantageously adjust the stable range settings to increase the size of the stable range to an adjusted stable range $SR_A$ so as allow for an activation of the proximity switch. The increased stable range setting $SR_A$ may be a temporary relaxation of the setting requirements for detecting activation that defaults back to the normal settings after a time period or upon deactivation of a vehicle or certain number of attempts or may be a more permanent adjustment.

Figure 9:
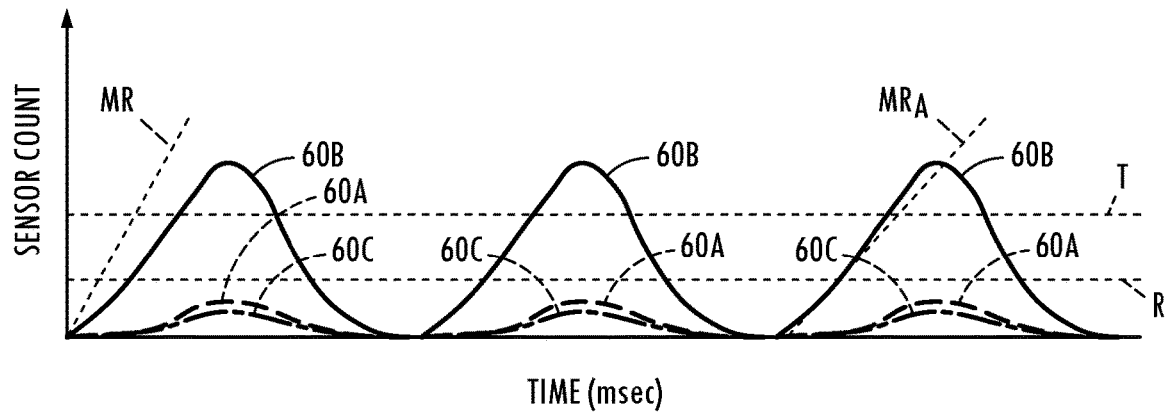
FIG. 9 is a graph illustrating adaptive learning by adjusting the minimum rate, according to a further embodiment.

Referring to FIG. 9, one example of the signal response during a wrong touch condition and an adaptive learning thereof, is illustrated in which a minimum rate MR is adjusted after repeated failed attempts to activate a proximity switch. Activation of a switch may occur when the rate of increase in the maximum signal exceeds a minimum rate MR. In this example, a failed attempted activation of proximity switch 22B is repeated three times during which the same maximum signal for all three attempts is realized. When this occurs, the proximity switch assembly and method may advantageously relax the rate monitoring to allow activation. This is achieved by adjusting the minimum rate MR to a reduced adjusted minimum rate $MR_A$ which may allow for activation of the proximity switch 22B based on comparison of the rate of increase of signal 60B to the adjusted minimum rate $MR_A$.

Figure 10:
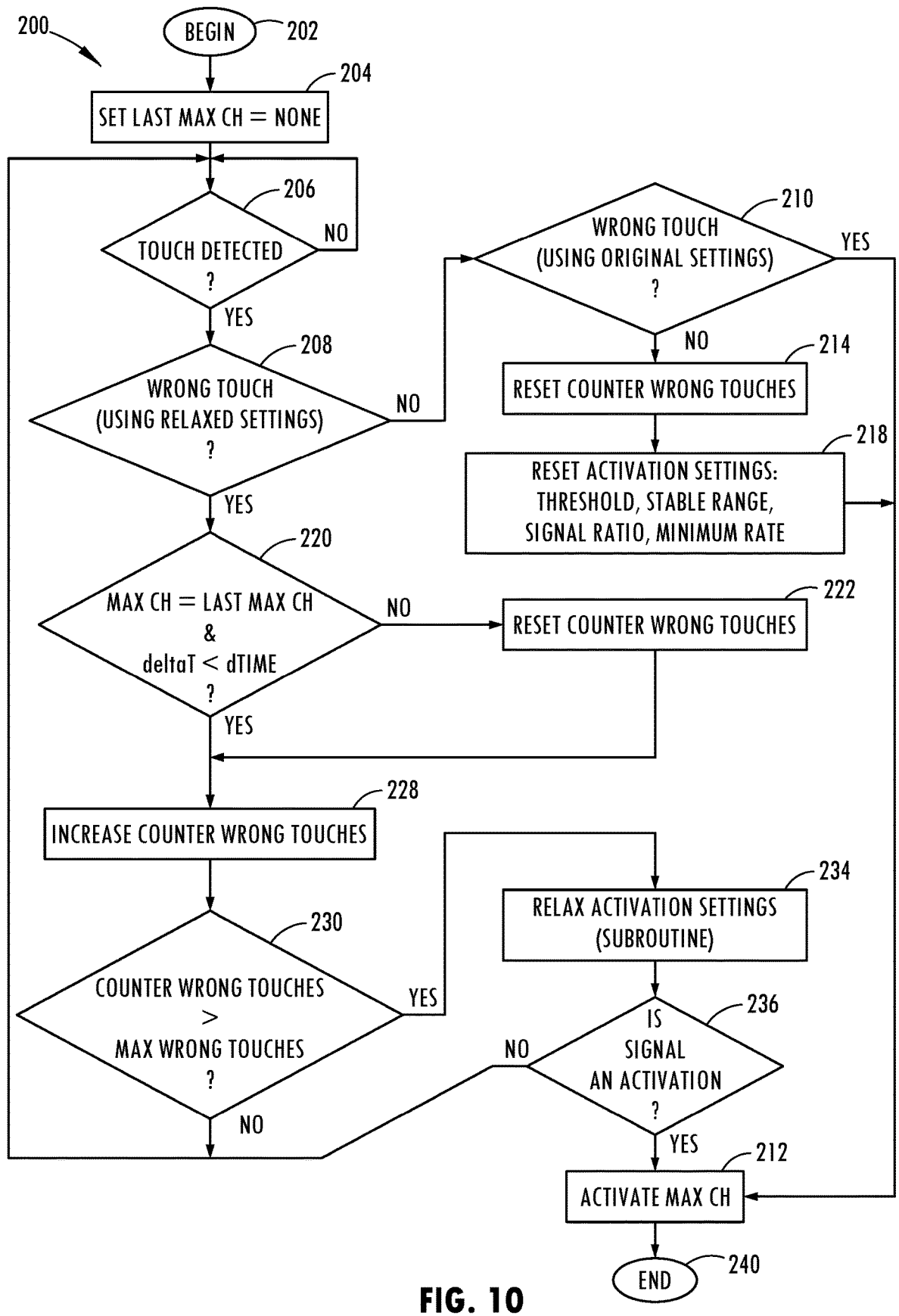
FIG. 10 is a flow diagram illustrating a method of proximity switch activation control that adjusts one or more settings based on multiple attempted activations of a switch that is not allowed.

The proximity switch assembly 20 employs an adaptive learning routine 200 which may be stored within memory 28 of controller 24 and executed by microprocessor 26, according to one embodiment. The adaptive learning routine 200 detects the wrong touch conditions based on multiple attempted activations of a proximity switch that is not allowed and adjusts one or more settings to provide for adaptive learning to allow activation of the proximity switch in situations where insufficient activations of a switch that a user is attempting to activate are repeatedly attempted. The adaptive learning routine 200 is illustrated in FIG. 10, according to one embodiment. Routine 200 begins at step 202 and proceeds to step 204 to set the last maximum signal channel equal to none so as to reset the value. Next, at decision step 206, routine 200 determines if a user touch of the proximity assembly has been detected and, if not, waits for the detection of a user touch. Once a user touch has been detected, routine 200 proceeds to decision step 208 to determine whether a wrong touch condition has occurred while using relaxed settings or parameters. If no such wrong touch condition has occurred, routine 200 proceeds to decision step 210 to determine whether a wrong touch condition occurred using the original (e.g., default) settings and, if so, proceeds to step 212 to activate the proximity switch associated with the maximum signal channel before ending at step 240.

If a wrong touch condition using the original settings is not detected at step 210, routine 200 proceeds to step 214 to reset the counter labelled wrong touches. The wrong touches counter indicates the number of repeated wrong touch conditions that are detected for a switch. Next, at step 218, the activation settings are reset which may include one or more of a threshold, stable range, a signal ratio and a minimum rate, according to various embodiments. Routine 200 then proceeds to step 212 to activate the proximity switch associated with the maximum signal channel before ending at step 240.

Returning to decision block 208, if a wrong touch condition using relaxed settings is detected, routine 200 proceeds to decision step 220 to determine if the maximum signal channel is equal to the last maximum signal channel and if the deltaT time is less than dTIME. The deltaT time is the time since the first attempted activation, and the dTIME time is a time period, such as five (5) seconds, or more preferably in the range of two to four (2-4) seconds. If the conditions at step 220 are not met, routine 200 proceeds to step 222 to reset the counter wrong touches before proceeding to step 228. If the conditions in step 220 are met, routine 200 proceeds directly to step 228 to increase the counter wrong touches value. Thereafter, at decision step 230, routine 200 determines if the counter wrong touches value is greater than the maximum wrong touches value. The maximum wrong touches value may be a value of one or more, and more preferably two or more and is used to determine repeated attempted activations of a switch that is not allowed. If the counter wrong touches value is not greater than the maximum wrong touches, then routine 200 returns to step 206. If the counter wrong touches value is greater than the maximum wrong touches value, routine 200 proceeds to step 234 to relax the activation settings to thereby adjust one or more settings associated with the determining of an activation of the proximity switch. IN one example, the setting(s) are adjusted when three attempted activations occur in a time period of two to four (2-4) seconds. Following execution of the relaxed activation settings subroutine, routine 200 proceeds to decision step 236 to determine if the maximum signal associated with proximity switch is an activation and, if so, proceeds to step 212 to activate the proximity switch associated with the maximum signal channel before ending at step 240. If the signal is not an activation, routine 200 returns to step 206.

Figure 11:
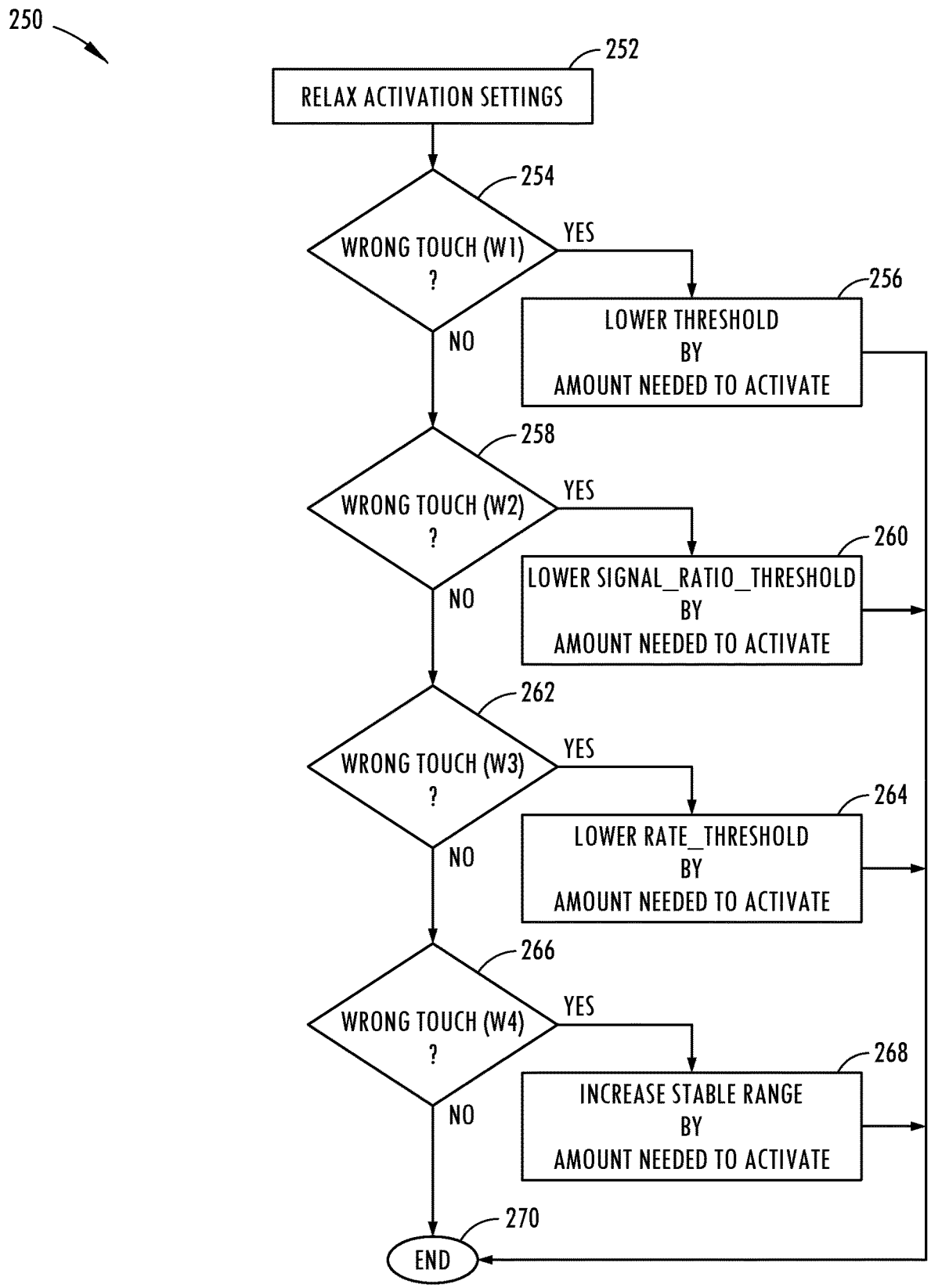
FIG. 11 is a flow diagram illustrating the relaxed activation settings subroutine of FIG. 10.

The relaxed activation settings subroutine 250 is illustrated in FIG. 11, according to one embodiment. Subroutine 250 begins at step 252 and proceeds to decision step 254 to determine if a wrong touch condition W1 exists. The wrong touch W1 condition may be a maximum signal that is below a threshold such as a signal resulting from a finger having poor conductive properties due to lotion on the finger or a glove covering the finger. If the wrong touch W1 condition is detected, subroutine 250 proceeds to step 256 to lower the activation threshold by an amount needed to activate the switch, before ending at step 270. If wrong touch W1 condition is not detected, subroutine 250 proceeds to decision step 258 to determine if wrong touch W2 condition is detected. Wrong touch W2 condition may be the condition where a signal ratio such as a maximum signal versus the other signal channels is too low, which may occur when two or more switches are attempted to be activated simultaneously. If a wrong touch W2 condition is detected, subroutine 250 proceeds to step 260 to lower the signal ratio threshold by an amount needed to activate the switch and thereafter ends at step 270. If wrong touch W2 condition is not detected, subroutine 250 proceeds to decision step 262 to determine if a wrong touch W3 condition is detected. The wrong touch W3 condition may occur when the rate of the signal increases too slow, which may occur when a finger slowly approaches the proximity sensor assembly, particularly when a glove is worn on the user's finger. If a wrong touch W3 condition is detected, subroutine 250 proceeds to step 264 to lower the signal rate threshold by an amount needed to activate the proximity switch, before ending at step 270. If wrong touch W3 condition is not detected, subroutine 250 proceeds to decision step 266 to determine if a wrong touch W4 condition is detected. The wrong touch W4 condition may occur when the signal is unstable, which may occur when a person's finger is shaking or there is excess noise in the signal. If a wrong touch W4 condition is detected, subroutine 250 proceeds to step 268 to increase the stable range by an amount needed to activate the switch before ending at step 270. Accordingly, subroutine 250 determines one or more wrong touch conditions such as conditions W1, W2, W3 and W4 and adjusts one or more settings based on the attempted activation so as to provide adaptive learning to allow activation of the proximity switch following repeated attempts by a user.

Accordingly, the proximity switch arrangement 20 advantageously provides for enhanced user interaction and user perceived feedback to a user to indicate whether the proximity switches have been properly activated to perform an action that is available. The switch assembly 20 allows users to be trained on use of the switch arrangement with feedback. Additionally, the switch arrangement may be less distractive by providing the user with perceived feedback, which is particularly advantageous in automotive applications. The switch assembly 20 further provides adaptive learning by adjusting one or more settings when a repeated multiple wrong touch condition is detected to allow activation of a proximity switch and thus, adapts to the user's interface signature.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A method of activating a proximity switch assembly comprising:

detecting repeated attempts to activate a proximity switch that does not result in activation;
adjusting one or more settings based on the detected repeated attempts to provide adaptive learning;
detecting an allowed activation of the proximity switch based on the adjusted one or more settings; and
performing an action in response to the detected allowed activation.

2. The method of claim 1, wherein the step of adjusting one or more settings comprises adjusting an activation threshold.

3. The method of claim 1, wherein the step of adjusting one or more settings comprises adjusting a stable range value that is compared to a signal associated with the proximity switch to determine activation of the proximity switch.

4. The method of claim 1, wherein the step of adjusting one or more settings comprises adjusting a signal ratio of a signal associated with the proximity switch compared to another signal associated with one or more other proximity switches.

5. The method of claim 1 further comprising the step of generating a first user perceived feedback indicative of detection of repeated attempts to activate a proximity switch that does not result in activation.

6. The method of claim 5 further comprising the step of generating a different second user perceived feedback indicative of completion of the action.

7. The method of claim 6 further comprising the step of generating a different third user perceived feedback indicative of detection of an allowed activation of a switch.

8. The method of claim 1, wherein the proximity switch assembly is installed in a vehicle for use by a passenger in the vehicle.

9. The method of claim 1, wherein the proximity switch comprises a capacitive switch comprising one or more capacitive sensors.

10. The method of claim 1, wherein the step of detecting repeated attempts to activate a proximity switch that does not result in activation comprises detecting insufficient signal response during user interface with the proximity switch.

11. A proximity switch assembly comprising:

one or more proximity switches; and
control circuitry processing an activation field associated with each proximity switch to detect an allowed activation of a proximity switch, said control circuitry further detecting repeated attempts to activate a proximity switch that does not result in activation and adjusting one or more settings based on the attempted activations to provide adaptive learning.

12. The switch assembly of claim 11, wherein the one or more settings comprise an activation threshold.

13. The switch assembly of claim 11, wherein the one or more settings comprise a stable range value that is compared to a signal associated with the proximity switch to determine activation of the proximity switch.

14. The switch assembly of claim 11, wherein the one or more settings comprise a signature ratio of a signal associated with the proximity switch compared to another signal associated with one or more other proximity switches.

15. The switch assembly of claim 11 further comprising a feedback device for generating a first user perceived feedback when repeated attempts to activate a proximity switch that does not result in activation is detected.

16. The switch assembly of claim 15, wherein the feedback device generates a second different user perceived feedback indicative of completion of the action.

17. The switch assembly of claim 16, wherein the feedback device generates a different third user perceived feedback indicative of detection of an allowed activation of a switch.

18. The switch assembly of claim 11, wherein the plurality of proximity switches are installed in vehicle for use by a passenger in the vehicle.

19. The switch assembly of claim 11, wherein each of the proximity switches comprises a capacitive switch comprising a capacitive sensor.

* * * * *